United States Patent
Lo et al.

(10) Patent No.: US 7,221,294 B1
(45) Date of Patent: ***May 22, 2007

(54) MULTISPEED COMMUNICATIONS DEVICE

(75) Inventors: William Lo, Cupertino, CA (US);
Xiaopeng Chen, Plano, TX (US)

(73) Assignee: Marvell International Ltd., Hamilton (BM)

( * ) Notice: Subject to any disclaimer, the term of this patent is extended or adjusted under 35 U.S.C. 154(b) by 0 days.

This patent is subject to a terminal disclaimer.

(21) Appl. No.: 11/592,888

(22) Filed: Nov. 3, 2006

Related U.S. Application Data

(63) Continuation of application No. 11/124,997, filed on May 9, 2005, now Pat. No. 7,135,996.
(60) Provisional application No. 60/624,849, filed on Nov. 4, 2004.

(51) Int. Cl.
*H03M 5/06* (2006.01)
(52) U.S. Cl. ...................................................... 341/68
(58) Field of Classification Search ................. 341/68, 341/69, 70, 72; 713/300, 320, 323, 324; 370/463, 503
See application file for complete search history.

(56) References Cited

U.S. PATENT DOCUMENTS

| | | | |
|---|---|---|---|
| 5,881,074 A * | 3/1999 | Rao | 714/786 |
| 6,795,450 B1 | 9/2004 | Mills et al. | 370/463 |
| 6,868,088 B2 * | 3/2005 | Gibson et al. | 370/419 |
| 6,912,596 B2 * | 6/2005 | Skidmore et al. | 710/1 |
| 7,047,428 B2 * | 5/2006 | Bui | 713/320 |
| 7,054,947 B2 * | 5/2006 | Yun | 709/233 |
| 7,079,551 B2 * | 7/2006 | Shivnan | 370/469 |
| 2005/0135413 A1 | 6/2005 | Yang et al. | 370/463 |

* cited by examiner

*Primary Examiner*—Brian Young

(57) ABSTRACT

A physical layer device for a network device comprises a converter module that selectively converts an n-bit input to an m-bit output based on first and second mapping functions. A scrambler module selectively scrambles the m-bit output. An encoding module receives the m-bit output from the scrambler module and selectively maps the m-bit output based on the first mapping function to X level output signals and the m-bit output based on the second mapping function to Y level output signals, where X and Y are integers greater than one and X is different than Y.

36 Claims, 6 Drawing Sheets

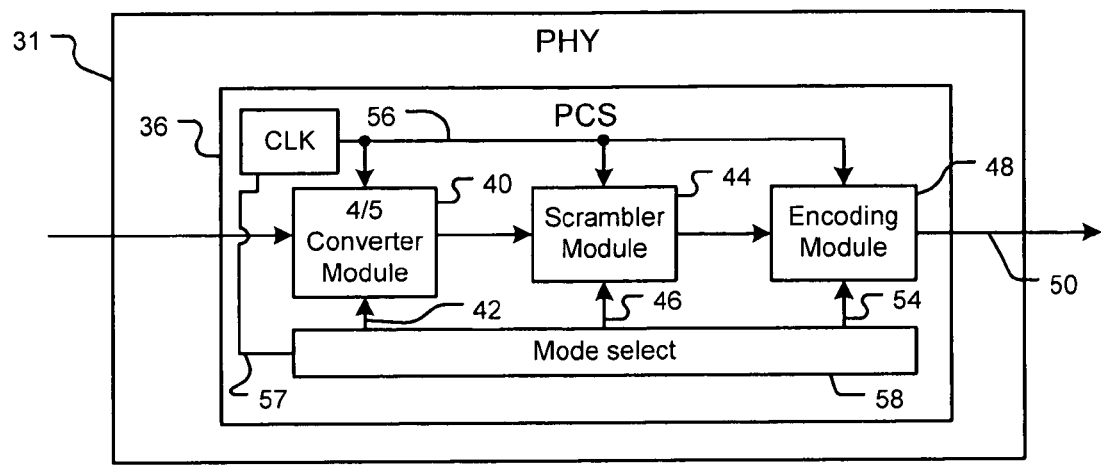
FIG. 2
| [msb:lsb] Two Bit | Symbol |
|---|---|
| 00 | +3 |
| 01 | +1 |
| 10 | −1 |
| 11 | −3 |
FIG. 5B
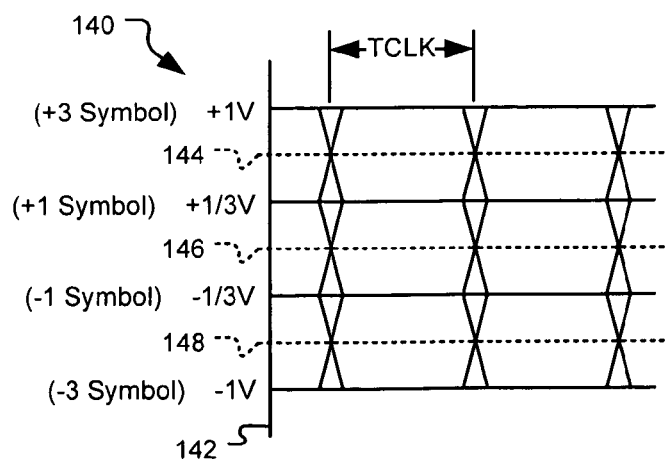
FIG. 6B

| Name | [msb:lsb] MAC | [msb:lsb] 100BASE-T | [msb:lsb] double/quad 100BASE-TX |
|---|---|---|---|
| 0 | 0000 | 11110 | 11110 |
| 1 | 0001 | 01001 | 00001 |
| 2 | 0010 | 10100 | 10100 |
| 3 | 0011 | 10101 | 10101 |
| 4 | 0100 | 01010 | 00110 |
| 5 | 0101 | 01011 | 01011 |
| 6 | 0110 | 01110 | 01110 |
| 7 | 0111 | 01111 | 00011 |
| 8 | 1000 | 10010 | 10010 |
| 9 | 1001 | 10011 | 10011 |
| A | 1010 | 10110 | 10110 |
| B | 1011 | 10111 | 10111 |
| C | 1100 | 11010 | 11010 |
| D | 1101 | 11011 | 11011 |
| E | 1101 | 11100 | 10000 |
| F | 1111 | 11101 | 00100 |
| I | undefined | 11111 | 11111 |
| J | 0101 | 11000 | 11000 |
| K | 0101 | 10001 | 10001 |
| T | undefined | 01101 | 01101 |
| R | undefined | 00111 | 00111 |
| H | err/undefined | 00100 | 11101 |
| V | undefined | 00000 | 00000 |
| V | undefined | 00001 | 01001 |
| V | undefined | 00010 | 00010 |
| V | undefined | 00011 | 01111 |
| V | undefined | 00101 | 00101 |
| V | undefined | 00110 | 01010 |
| V | undefined | 01000 | 01000 |
| V | undefined | 01100 | 01100 |
| V | undefined | 10000 | 11100 |
| V | undefined | 11001 | 11001 |

FIG. 4

| Direction (T-1) | Symbol (T-1) | One Bit (T) | Direction (T) | Symbol (T) |
|---|---|---|---|---|
| X | X | 0 | No Change | No Change |
| X | -1 | 1 | No Change | 0 |
| X | +1 | 1 | No Change | 0 |
| - | 0 | 1 | + | -1 |
| + | 0 | 1 | - | +1 |
FIG. 5A
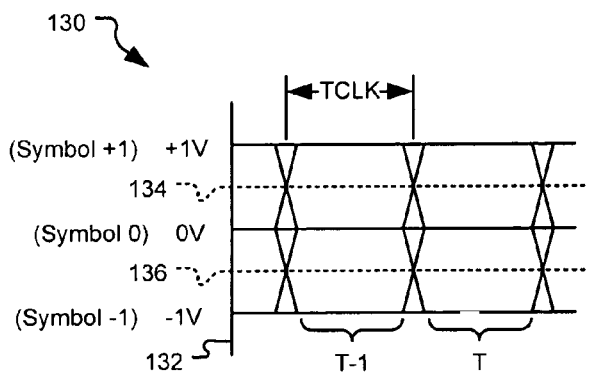
FIG. 6A
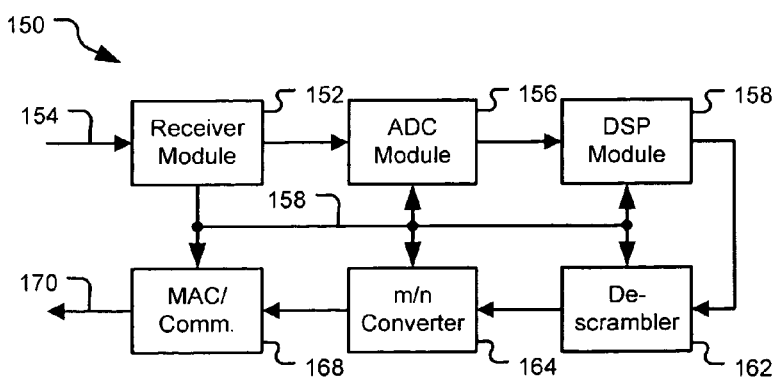
FIG. 7

| Run Type | Worst Case bit | Cycles |
|---|---|---|
| Negative Polarity Run | 120 to 126 | 60 to 63 |
| Positive Polarity Run | 110 to 116 | 55 to 58 |
| All 1's Run | 54 to 60 | 27 to 30 |
| All 0's Run | 40 to 46 | 20 to 23 |
| All 01 Run | 54 to 60 | 27 to 30 |
| All 10 Run | 54 to 60 | 27 to 30 |

FIG. 8

MULTISPEED COMMUNICATIONS DEVICE

CROSS-REFERENCE TO RELATED APPLICATIONS

This application is a continuation of U.S. patent application Ser. No. 11/124,997 filed on May 9, 2005, which claims the benefit of U.S. Provisional Application Ser. No. 60/624,849 that was filed on Nov. 4, 2004, the disclosures of which are hereby incorporated herein by reference in their entirety.

FIELD OF THE INVENTION

The present invention relates to network devices, and more particularly to physical coding sublayer (PCS) devices in physical layer devices.

BACKGROUND OF THE INVENTION

Hosts, such as computers, personal digital assistants (PDAs) and other network enabled devices, typically communicate with other link partners over a medium. The medium may be a fiber-optic cable or copper cable. Referring now to FIG. 1A, a first network device 10-1 includes a medium access control (MAC) device 16-1 and a physical layer (PHY) device 20-1. The MAC and PHY devices 16-1 and 20-1, respectively, may communicate using a media independent interface (MII). A transmit path of the PHY device 20-1 includes a physical coding sublayer (PCS) device 22-1. A second network device 10-2 or link partner includes similar components that are labeled with the same reference number having an "-2" extension in FIG. 1A. A medium 24 connects the first and second network devices 10-1 and 10-2.

Referring now to FIG. 1B, the PCS devices 22-1 and 22-2 (collectively PCS devices 22) for 100BASE-X are shown. The PCS devices 22 include a converter module 26 that converts 4 input bits to 5 output bits. A scrambler module 28 selectively performs scrambling for 100BASE-TX according to a scrambling algorithm and not for 100BASE-FX. An encoding module 30 performs encoding such as multi-level 3 (MLT3) modulation for 100BASE-TX and non return to zero inverted (NRZI) modulation for 100BASE-FX.

SUMMARY OF THE INVENTION

A physical layer device for a network device comprises a converter module that selectively converts an n-bit input to an m-bit output based on first and second mapping functions. A scrambler module selectively scrambles the m-bit output. An encoding module receives the m-bit output from the scrambler module and selectively maps the m-bit output based on the first mapping function to three level output signals and the m-bit output based on the second mapping function to four level output signals.

In other features, the three and four level output signals have positive and negative output levels. The second mapping function reduces a number of adjacent symbols in the four level output signal that have positive levels and a number of adjacent symbols in the four level output signal that have negative levels as compared to using the first mapping function and the four level output signal. The four level output signal is a 4-level pulse amplitude modulated (PAM) signal. The three level output signal includes one bit per symbol and the four level output signal includes two bits per symbol. A mode selector configures the converter module, the scrambler module and the encoding module based on a selected one of a plurality of protocols.

In other features, the encoding module selects between multi-level 3 (MLT3) modulation, non-return to zero inverted (NRZI) modulation and the PAM. The physical layer device is connected to a medium that is selected from copper cable and fiber-optic cable. A clock communicates with the converter module, the scrambler module and the encoding module and selectively provides first and second clock signals having a different frequency. The physical layer device supports operation at 100BASE-TX, 100BASE-FX, double speed 100BASE-TX and quad speed 100BASE-TX.

A physical layer device for a network device comprises converter means for selectively converting an n-bit input to an m-bit output based on first and second mapping functions. Scrambler means scrambles the m-bit output. Encoding means receives the m-bit output from the scrambler means and selectively maps the m-bit output based on the first mapping function to three level output signals and the m-bit output based on the second mapping function to four level output signals.

In other features, the three and four level output signals have positive and negative output levels. The second mapping function reduces a number of adjacent symbols in the four level output signal that have positive levels and a number of adjacent symbols in the four level output signal that have negative levels as compared to using the first mapping function with the four level output signal. The four level output signal is a 4-level pulse amplitude modulated (PAM) signal. The three level output signal includes one bit per symbol. The four level output signal includes two bits per symbol.

In other features, mode selecting means configures the converter means, the scrambler means and the encoding means based on a selected one of a plurality of protocols. The encoding means selects between multi-level 3 (MLT3) modulation, non-return to zero inverted (NRZI) modulation and the PAM. The physical layer device is connected to a medium that is selected from copper cable and fiber-optic cable. Timing means communicates with the converter means, the scrambler means and the encoding means and selectively provides first and second clock signals having a different frequency. The physical layer device supports operation at 100BASE-TX, 100BASE-FX, double speed 100BASE-TX and quad speed 100BASE-TX.

A physical layer device for a network device comprises decoding means for receiving three level and four level signals from a medium and for selectively decodes the three level and four level signals to m-bit signals. Descrambler means selectively descrambles the m-bit signals. Converter means selectively converts the m-bit signals based on the three level signal to an n-bit signal using a first mapping function and the m-bit signals based on the four level signal to the n-bit signals using a second mapping function.

In other features, the three and four level signals have positive and negative output levels. The second mapping function reduces a number of adjacent symbols in the four level signals that have positive levels and a number of adjacent symbols in the four level signals that have negative levels as compared to using the first mapping function and the four level output signals. The four level output signals are 4-level pulse amplitude modulated (PAM) signals. The three level output signals include one bit per symbol. The four level output signals include two bits per symbol. Mode selecting means configures the converter means, the descrambler means and the decoding means based on a selected one of a plurality of protocols. The decoding means selects between multi-level 3 (MLT3) modulation, non-return to zero inverted (NRZI) modulation and the PAM. The medium is selected from a group consisting of copper cable and fiber-optic cable. Clock generating means communicates with the converter means, the descrambler means and the decoding means and selectively provides first and second clock signals having a different frequency.

Further areas of applicability of the present invention will become apparent from the detailed description provided hereinafter. It should be understood that the detailed description and specific examples, while indicating the preferred embodiment of the invention, are intended for purposes of illustration only and are not intended to limit the scope of the invention.

BRIEF DESCRIPTION OF THE DRAWINGS

The present invention will become more fully understood from the detailed description and the accompanying drawings, wherein:

FIG. 2 is a functional block diagram of a physical layer device with a PCS according to the present invention;

FIG. 4 is a table used by a converting module;

FIGS. 5A and 5B are tables of pulse amplitude modulation codes;

FIGS. 6A and 6B are timing diagrams of signal waveforms;

FIG. 7 is a functional block diagram of a receiver channel compatible with the PCS of FIG. 2; and FIG. 8 is a table illustrating the performance of the second mapping function of FIG. 4.

DETAILED DESCRIPTION OF THE PREFERRED EMBODIMENTS

Figure 1A:
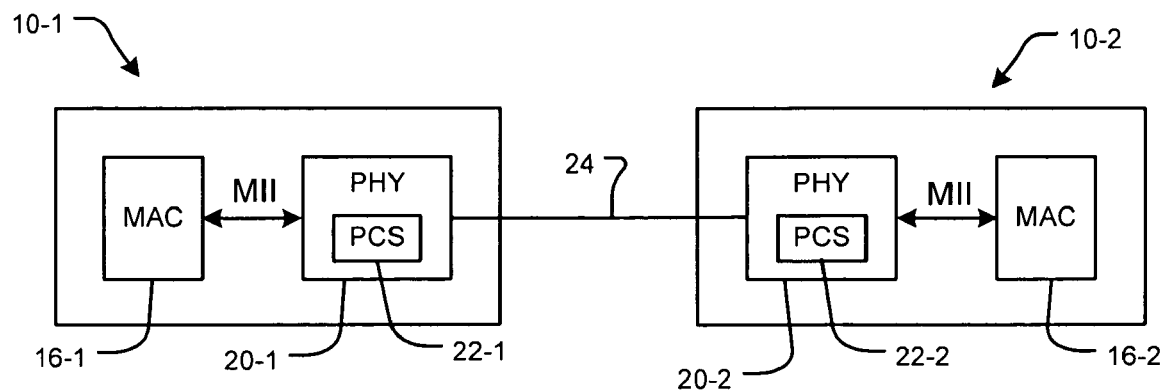
FIG. 1A is a functional block diagram of network devices according to the prior art.
Figure 1B:
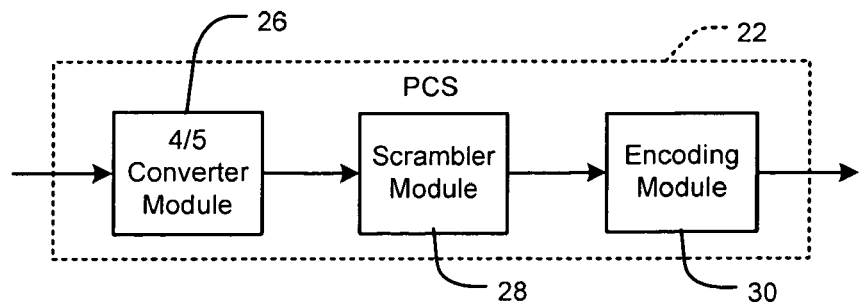
FIG. 1B is a functional block diagram of a physical layer device including a physical coding sublayer (PCS) according to the prior art.

The following description of the preferred embodiment(s) is merely exemplary in nature and is in no way intended to limit the invention, its application, or uses. For purposes of clarity, the same reference numbers will be used in the drawings to identify similar elements. As used herein, the term module and/or device refers to an application specific integrated circuit (ASIC), an electronic circuit, a processor (shared, dedicated, or group), and memory that execute one or more software or firmware programs, a combinational logic circuit, and/or other suitable components that provide the described functionality. For purposes of clarity, the same reference numerals will be used to identify similar elements. References to logical one, true, and on are equivalent to each other, and references to logical zero, false, and off are equivalent to each other, unless otherwise noted. Parts or all of the invention may also be implemented with equivalent embodiments using logic that is inverted from that disclosed.

A PHY device according to the present invention includes a PCS device that can be configured to support at 100BASE-TX, 100BASE-FX, double speed 100BASE-TX and quad speed 100BASE-TX is shown. Referring now to FIG. 2, a functional block diagram of a PHY device 31 with a PCS device 36 is shown. The PCS device 36 receives data from a MAC device. Data is received by a 4-bit to 5-bit (4/5) converter module 40. The converter module 40 converts a 4-bit input to a 5-bit output. The converter module 40 has a selection signal input 42 for selecting between first and second mapping functions. Examples of the first and second mapping functions are shown in FIG. 4 and described below. The converter module 40 outputs the 5-bit output to a scrambler module 44.

The scrambler module 44 has an enable input 46 that determines whether the scrambler module 44 is activated or deactivated. When activated, the scrambler module 44 generates a 5-bit scrambled output by applying a scrambler algorithm to each 5-bit input that is received. In an example embodiment, the scrambler algorithm is $x^{11+x^9}+1$, although other scrambler algorithms may be used. When the scrambler module 44 is deactivated, the 5-bits are passed through unchanged.

An encoder module 48 receives the 5-bits from the scrambler module 44 and generates an output signal 50. A mode selection input 54 of the encoder module 48 determines an encoding mode that is used by the encoding module 48. In an example embodiment, the mode selection input 54 selects between a non-return to zero inverted (NRZI) mode, a multi-level 3 (MLT3) mode, and a 4-level pulse amplitude modulation (PAM) mode. The encoder module 48 modulates the output signal 50 in accordance with the 5-bits received and the encoding mode selected by the mode selection input 54. When the encoding module 48 is using the MLT3 mode, it receives one bit per clock period from the scrambler module 44. When the modulator 48 is using the 4-level PAM mode it receives two bits per clock period from the scrambler module 44.

A clock generates a clock signal 56 that has a period TCLK. The clock signal 56 is applied to the converter module 40, the scrambler module 44, and the encoding module 48. The converter module 40 and the scrambler module 44 each process one symbol during each TCLK period. The symbol may include one or two bits depending on the mode. A clock speed selection signal 57 selects a frequency of the clock signal 56. In some implementations, the frequency is switchable between first and second frequencies such as 125 MHz and 250 MHz, which correspond to TCLK periods of 8 nS and 4 nS, respectively.

A mode select module 58 selects the mode of operation. In an example embodiment, the mode select module 58 selects between at 100BASE-TX, 100BASE-FX, double speed 100BASE-TX and quad speed 100BASE-TX. The converter module 40 and the scrambler module 44 operate together to minimize DC level drift.

Figure 3:
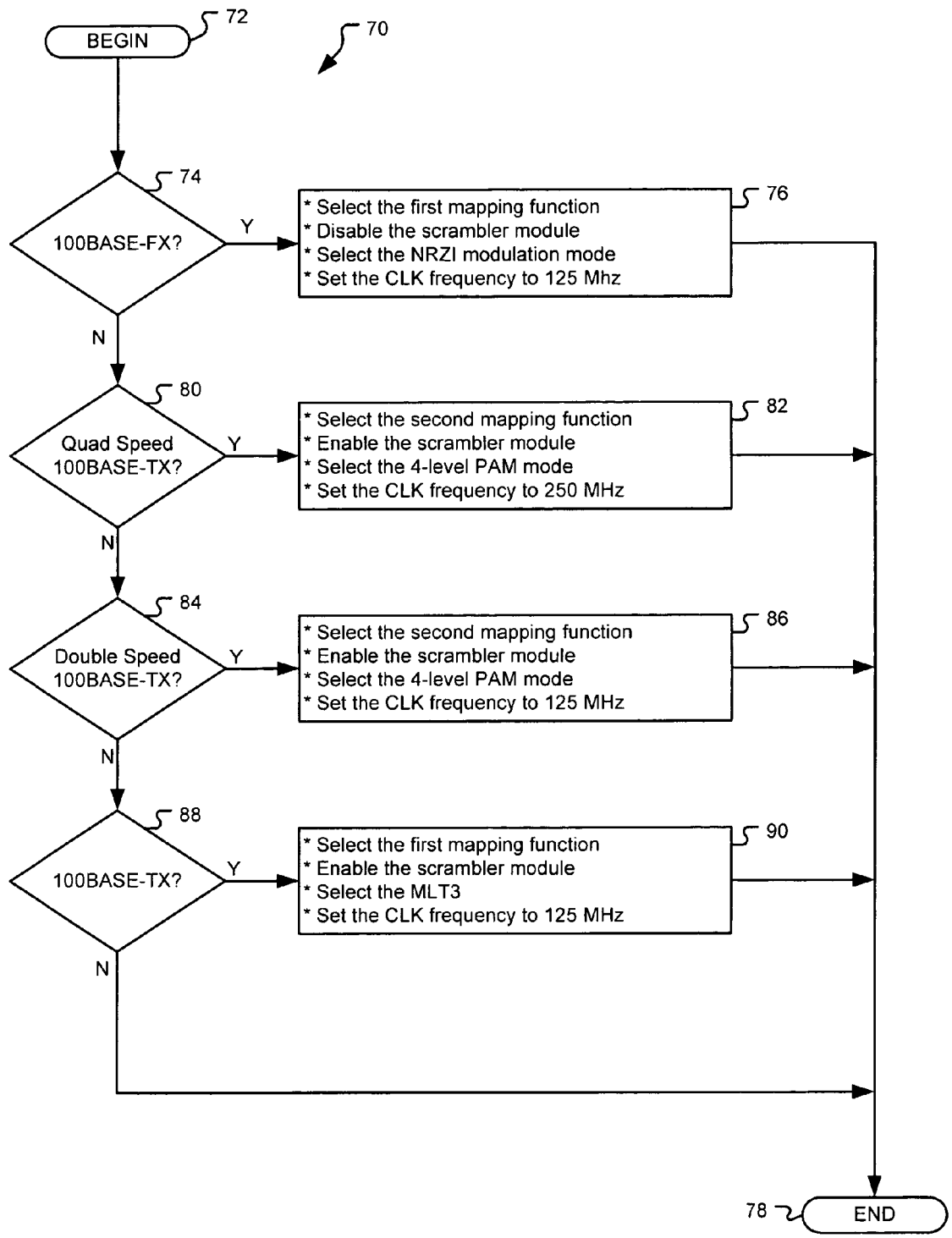
FIG. 3 is a flowchart of a method for configuring the physical layer device of FIG. 2.

Turning now to FIG. 3, a flow chart shows steps of a method 70 for configuring the PCS device 36 of the PHY device 31. The method 70 begins with step 72 and proceeds to decision step 74. In decision step 74, control determines whether the network medium 38 is 100BASE-FX. If it is, control proceeds to step 76 and configures the PHY device 31 for operation with the fiber-optic type of network medium. In step 76, control sets the frequency of the clock 56 to 125 MHz, selects the first mapping function via the selection signal input 42, and selects the NRZI modulation mode via the mode selection input 54. Control proceeds to exit step 78 after completing the actions of step 76.

Returning now to decision step 74, if control determines that the network medium is not 100BASE-FX, then control proceeds to decision step 80. In decision step 80, control determines whether the quad speed 100BASE-TX communication protocol is to be used. If so, control proceeds to step 82 and sets the symbol frequency of the clock 56 to 250

MHz, selects the second mapping function via the selection signal input 42, and selects the 4-level PAM mode via the mode selection input 54. Two bits per symbol are used. Control proceeds to exit step 78 after completing the actions of step 82.

Returning now to decision step 80, control proceeds to decision step 84 if quad speed 100BASE-TX communication protocol is not used. In decision step 84, control determines whether double speed 100BASE-TX communication protocol is to be used. If so, control proceeds to step 86 and sets the symbol frequency of the clock 56 to 125 MHz, selects the second mapping function via the selection signal input 42, and selects the 4-level PAM mode via the mode selection input 54. Two bits per symbol are used. Control proceeds to exit step 78 after completing the actions of step 86.

Returning now to decision step 84, control proceeds to decision step 88 if it determines that the double speed 100BASE-TX communication protocol is not to be used. In decision step 88, control determines whether the 100BASE-TX communication protocol is to be used. If so, control proceeds to step 90 and sets the symbol frequency of the clock 56 to 125 MHz, selects the first mapping function via the selection signal input 42, and selects the MLT3 mode via the mode selection input 54. One bit per symbol is used. Control proceeds to exit step 78 after completing the actions of step 90. Returning now to decision step 88, control proceeds to exit step 78 if it determines that 100BASE-TX communication is not used.

Turning now to FIG. 4, a conversion table 100 is shown for the converter module 40. While the conversion table contains symbols for a 4-bit/5-bit converter module 40, it is understood that other values of input and output bits may be used. A first column 102 indicates names for input symbols that the MAC 34 receives through the communication interface 32. A second column 84 indicates a 4-bit pattern for each symbol name 102 on a same row. A third column 106 provides a 5-bit output pattern that corresponds to the 4-bit pattern on the same row. The converter module uses the 5-bit output patterns of the third column 106 when the selection signal input 42 indicates that the first mapping function is to be used. A fourth column 108 provides rows of 5-bit output patterns that correspond to the 4-bit pattern on the same row. The converter module 40 uses the 5-bit output patterns of the fourth column 108 when the selection signal input 42 indicates that the second mapping function is to be used. The 5-bit patterns in the third and fourth columns 106, 108 are similar with a limited exceptions. In particular, the 5-bit patterns for the symbols named "1", "4", "7", "E", "F", "H", and four of the symbols named "V", are different as highlighted by cross-hatched backgrounds. When the network interface 30 is operating in the double speed 100BASE-TX or the quad speed 100BASE-TX modes, it is preferred that the PHY module 31 converts incoming 4-bit "H" symbols to the "E" symbol (1110) prior to the 4-bit/5-bit conversion. The 5-bit patterns of the fourth column 108 are empirically determined to maximize the probability of a significant state change (ex. From +3 to −3 or −1, and from −3 to +1 or +3) in the 4-level output signal 50. By maximizing the probability of a significant state change with each TCLK, the risk is minimized of a DC bias forming on the network medium 38.

Turning now to FIG. 5A, a one-bit symbol mapping table 110 is shown. The modulator 48 implements the one-bit symbol mapping table 110 when the mode selection input 54 indicates that the MLT3 mode is to be used. A previous direction state 111, a previous output symbol 112, and a present input bit 113 are used to generate an output symbol 115 at a present time T (FIG. 6A). The mapping table 110 also shows that a new direction state 114 is generated with each determination of the output symbol 115. A first column provides the possible direction states 111. A second column provides the possible previous output symbols 112, and a third column provides the possible input bits 113. As can be seen from the mapping table 110, an input bit 113 of "0" always causes the output symbol 115 to remain constant. An input bit 113 of "1", however, causes the output symbol 115 to change depending on the previous direction state 111 and the previous output symbol 112 was "0". For example, if the previous direction state 111 was negative (−) and the previous output symbol 112 was "0", then the new output symbol 112 is −1 and the new direction state 114 is positive (+). The output symbol 115 may be applied to the output signal 50 as a voltage or other electrical signal. For example, a +1V level at the output signal 50 may represent the symbol of +1, and a −1V level at the output signal 50 may represent the symbol of −1. When using the symbols from the conversion table 100 and the one-bit symbol mapping table 110 it is preferred that the scrambler module 44 sends the bits to the modulator 48 in order from the most significant bit (msb) to the least significant bit (Isb).

Turning now to FIG. 5B, a two-bit symbol mapping table 120 is shown. The modulator 48 implements the two-bit symbol mapping table 120 when the mode selection input 54 indicates that the 4-level PAM mode is to be used. A first column 122 provides the possible input values to the modulator 48. A second column 124 provides output symbols that correspond with the input values 122 on the same row. For example, an input value of 00 generates an output symbol of +3. An input value of 01 generates an output symbol of +1. An input value of 10 generates an output symbol of −1. An input value of 11 generates an output symbol of −3. The output symbol may be applied to the output signal 50 as a voltage or other electrical signal. For example, a +1V level at the output signal 50 may represent the symbol of +1, and a −1V level at the output signal 50 may represent the symbol of −1. When using the symbols from the conversion table 100 in combination with the two-bit symbol mapping table 120, it is preferred that the scrambler module 44 sends the bits to the modulator in order from msb to Isb. Also, it is then preferred that the modulator 48 send the bits in order from msb to Isb. This minimizes the DC drift on the network medium 38.

Turning now to FIG. 6A, a timing diagram 130 is shown of an MLT3 modulated output signal 50. A vertical axis 132 represents voltage and a horizontal axis represents time. A first voltage threshold 134 provides a predetermined voltage defining a lower voltage boundary for the +1 symbol. A second voltage threshold 136 provides a predetermined voltage defining an upper voltage boundary for the −1 symbol. The clock period TCLK prescribes a time period for transmitting each symbol.

Turning now to FIG. 6B, a timing diagram 140 is shown of a 4-level output signal 50. A vertical axis 142 represents voltage and a horizontal axis represents time. A first voltage threshold 144 provides a predetermined voltage defining a boundary between the +3 symbol and the +1 symbol. A second voltage threshold 146 provides a predetermined voltage defining a boundary between the +1 symbol and the −1 symbol. A third voltage threshold 148 provides a predetermined voltage defining a boundary between the −1 symbol and the −3 symbol. The clock period TCLK prescribes a time period for transmitting each symbol.

Referring now to FIG. 7, a functional block diagram of a receiver 150 is shown. A filter module 152 filters noise from an incoming modulated signal 154 and provides a filtered signal to an analog to digital conversion (ADC) module 156. The filter module 152 also detects the level changes in the incoming modulated signal 154 and generates a synchronization signal 158 therefrom. The synchronization signal 158 is applied to some or all of the functional blocks of the receiver 150. The ADC module 156 digitizes the filtered signal and provides a digitized signal to a digital signal processor (DSP) module 160. The DSP 160 reconstructs the scrambled m-bit data and provides it to a descrambler 162. The descrambler 162 implements a complement to the scrambler equation used in the scrambler module 44. The descrambler 162 provides an unscrambled m-bit message to an m-bit to n-bit converter (m/n converter) 164. The m/nconverter 164 108 maps the unscrambled m-bit data to n-bit data in accordance with the conversion table 100. The n-bit data is provided to a MAC 168, which communicates the m-bit data to a receiving host (not shown) via a communication bus 170, such as an MII bus.

Referring now to FIG. 8, a table illustrating performance parameters of the double/quad speed 100 BASE-TX mapping in FIG. 4 is shown. If the first mapping is used in conjunction with four output levels, there can be long runs all positive or all negative symbols, which may cause baseline wander. In some circumstances, the first mapping used in conjunction with four output levels may cause an infinite run or all positive or all negative symbols. The second mapping, however, constrains the number of adjacent symbols that are all positive or all negative as shown and thus reduces the likelihood of baseline wander.

Those skilled in the art can now appreciated from the foregoing description that the broad teachings of the present invention can be implemented in a variety of forms. Therefore, while this invention has been described in connection with particular examples thereof, the true scope of the invention should not be so limited since other modifications will become apparent to the skilled practitioner upon a study of the drawings, the specification and the following claims.

What is claimed is:

1. A physical layer device for a network device, comprising:
   a converter module that selectively converts an n-bit input to an m-bit output based on first and second mapping functions;
   a scrambler module that selectively scrambles said m-bit output; and
   an encoding module that receives said m-bit output from said scrambler module and that selectively maps said m-bit output based on said first mapping function to X level output signals and said m-bit output based on said second mapping function to Y level output signals, where X and Y are integers greater than one and X is different than Y.

2. The physical layer device of claim 1 wherein said X and Y level output signals have positive and negative output levels and wherein said second mapping function reduces a number of adjacent symbols in said Y level output signal that have positive levels and a number of adjacent symbols in said Y level output signal that have negative levels as compared to using said first mapping function with said Y level output signal.

3. The physical layer device of claim 1 wherein said Y level output signal is a 4-level pulse amplitude modulated (PAM) signal.

4. The physical layer of claim 1 wherein said X level output signal includes one bit per symbol and wherein said Y level output signal includes two bits per symbol.

5. The physical layer device of claim 1 further comprising a mode selector that configures said converter module, said scrambler module and said encoding module based on a selected one of a plurality of protocols.

6. The physical layer device of claim 3 wherein said encoding module selects between multi-level 3 (MLT3) modulation, non-return to zero inverted (NRZI) modulation and said PAM.

7. The physical layer device of claim 1 wherein said physical layer device is connected to a medium that is selected from copper cable and fiber-optic cable.

8. The physical layer device of claim 1 further comprising a clock that communicates with said converter module, said scrambler module and said encoding module and that selectively provides first and second clock signals having a different frequency.

9. The physical layer device of claim 5 wherein said physical layer device supports 100BASE-TX, 100BASE-FX, double speed 100BASE-TX and quad speed 100BASE-TX.

10. A physical layer device for a network device, comprising:
    a decoding module that receives X level and Y level signals from a medium and that selectively decodes said X level and Y level signals to m-bit signals;
    a descrambler module that selectively descrambles said m-bit signals; and
    a converter module that selectively converts said m-bit signals based on said X level signal to an n-bit signal using a first mapping function and said m-bit signals based on said Y level signal to said n-bit signals using a second mapping function, where X and Y are integers greater than one and X is different than Y.

11. The physical layer device of claim 10 wherein said X and Y level signals have positive and negative output levels and wherein said second mapping function reduces a number of adjacent symbols in said Y level signals that have positive levels and a number of adjacent symbols in said Y level signals that have negative levels as compared to using said first mapping function with said Y level output signals.

12. The physical layer device of claim 10 wherein said Y level output signals are 4-level pulse amplitude modulated (PAM) signals.

13. The physical layer of claim 10 wherein said X level output signals include one bit per symbol and wherein said Y level output signals include two bits per symbol.

14. The physical layer device of claim 10 further comprising a mode selector that configures said converter module, said descrambler module and said decoding module based on a selected one of a plurality of protocols.

15. The physical layer device of claim 12 wherein said decoding module selects between multi-level 3 (MLT3) modulation, non-return to zero inverted (NRZI) modulation and said PAM.

16. The physical layer device of claim 10 wherein said medium is selected from a group consisting of copper cable and fiber-optic cable.

17. The physical layer device of claim 10 further comprising a clock that communicates with said converter module, said descrambler module and said decoding module and that selectively provides first and second clock signals having a different frequency.

18. The physical layer device of claim 14 wherein said physical layer device supports 100BASE-TX, 100BASE-FX, double speed 100BASE-TX and quad speed 100BASE-TX.

19. A method for operating a physical layer device for a network device, comprising:
selectively converting an n-bit input to an m-bit output based on first and second mapping function;
selectively scrambling said m-bit output; and
receiving said m-bit output; and
selectively mapping said m-bit output based on said first mapping function to X level output signals and said m-bit output based on said second mapping function to Y level output signals, where X and Y are integers greater than one and X is different than Y.

20. The method of claim 19 wherein said X and Y level output signals have positive and negative output levels and wherein said second mapping function reduces a number of adjacent symbols in said Y level output signal that have positive levels and a number of adjacent symbols in said Y level output signal that have negative levels as compared to using said first mapping function with said Y level output signal.

21. The method of claim 19 wherein said Y level output signal is a 4-level pulse amplitude modulated (PAM) signal.

22. The method of claim 19 wherein said X level output signal includes one bit per symbol and wherein said Y level output signal includes two bits per symbol.

23. The method of claim 19 further comprising configuring at least one module of said physical layer device based on a selected one of a plurality of protocols.

24. The method of claim 19 further comprising selecting between multi-level 3 (MLT3) modulation, non-return to zero inverted (NRZI) modulation and said PAM.

25. The method of claim 19 further comprising connecting said physical layer device to a medium that is selected from copper cable and fiber-optic cable.

26. The method of claim 19 further comprising selectively providing first and second clock signals having a different frequency to at least one module of said physical layer device.

27. The method of claim 23 wherein said physical layer device supports 100BASE-TX, 100BASE-FX, double speed 100BASE-TX and quad speed 100BASE-TX.

28. A method for operating a physical layer device for a network device, comprising:
receiving X level and Y level signals from a medium;
selectively decoding said X level and Y level signals to m-bit signals;
selectively descrambling said m-bit signals; and
selectively converting said m-bit signals based on said X level signal to an n-bit signal using a first mapping function and said m-bit signals based on said Y level signal to said n-bit signals using a second mapping function, where X and Y are integers greater than one and X is different than Y.

29. The method of claim 28 wherein said X and Y level signals have positive and negative output levels and wherein said second mapping function reduces a number of adjacent symbols in said Y level signals that have positive levels and a number of adjacent symbols in said Y level signals that have negative levels as compared to using said first mapping function with said Y level output signals.

30. The method of claim 28 wherein said Y level output signals are 4-level pulse amplitude modulated (PAM) signals.

31. The method of claim 28 wherein said X level output signals include one bit per symbol and wherein said Y level output signals include two bits per symbol.

32. The method of claim 28 further comprising configuring said converter module, said descrambler module and said decoding module based on a selected one of a plurality of protocols.

33. The method of claim 30 further comprising selecting between multi-level 3 (MLT3) modulation, non-return to zero inverted (NRZI) modulation and said PAM.

34. The method of claim 28 wherein said medium is selected from a group consisting of copper cable and fiber-optic cable.

35. The method of claim 28 further comprising selectively providing first and second clock signals having a different frequency to at least one module of said physical layer.

36. The method of claim 32 wherein said physical layer device supports 100BASE-TX, 100BASE-FX, double speed 100BASE-TX and quad speed 100BASE-TX.

* * * * *

UNITED STATES PATENT AND TRADEMARK OFFICE
CERTIFICATE OF CORRECTION

PATENT NO. : 7,221,294 B1  
APPLICATION NO. : 11/592888  
DATED : May 22, 2007  
INVENTOR(S) : William Lo et al.

Page 1 of 1

It is certified that error appears in the above-identified patent and that said Letters Patent is hereby corrected as shown below:

| | |
|---|---|
| Column 2, Line 49 | Delete "for" after "medium and" |
| Column 4, Line 14 | Delete "$x^{11+x+9}+1$" and insert --$x^{11}+x^9+1$-- |
| Column 5, Line 48 | Delete "a" after "with" |
| Column 6, Line 25 | Delete "(Isb)" and insert --(lsb)--. |
| Column 6, Line 44 | Delete "Isb" and insert --lsb--. |
| Column 6, Line 46 | Delete "Isb" and insert --lsb--. |
| Column 7, Lines 16-17 | Delete "m/nconverter" and insert --m/n converter-- |
| Column 7, Line 17 | Delete "108" after "164" |
| Column 7, Line 33 | Delete "appreciated" and insert --appreciate-- |
| Column 8, Line 1 | Insert --device-- after "layer" |
| Column 8, Line 48 | Insert --device-- after "layer" |

Signed and Sealed this

Seventh Day of August, 2007

JON W. DUDAS  
*Director of the United States Patent and Trademark Office*